(12) United States Patent  (10) Patent No.: US 8,232,722 B2
Bawendi et al.  (45) Date of Patent: Jul. 31, 2012

(54) LIGHT EMITTING DEVICES INCLUDING SEMICONDUCTOR NANOCRYSTALS

(75) Inventors: Moungi G. Bawendi, Cambridge, MA (US); Vladimir Bulovic, Lexington, MA (US); Seth Coe-Sullivan, Belmont, MA (US); Jean-Michel Caruge, Cambridge, MA (US); Jonathan Steckel, Cambridge, MA (US); Alexi Arango, Somerville, MA (US); Jonathan E. Halpert, Cambridge, MA (US)

(73) Assignee: Massachusetts Institute of Technology, Cambridge, MA (US)

(*) Notice: Subject to any disclaimer, the term of this patent is extended or adjusted under 35 U.S.C. 154(b) by 630 days.

(21) Appl. No.: 11/354,185

(22) Filed: Feb. 15, 2006

(65) Prior Publication Data

US 2007/0103068 A1 May 10, 2007

Related U.S. Application Data

(60) Provisional application No. 60/653,094, filed on Feb. 16, 2005.

(51) Int. Cl.
*H05B 33/14* (2006.01)
*H05B 33/18* (2006.01)

(52) U.S. Cl. .................................. 313/506; 313/509

(58) Field of Classification Search .................. 313/498, 313/504, 506
See application file for complete search history.

(56) References Cited

U.S. PATENT DOCUMENTS

| | | | |
|---|---|---|---|
| 5,512,131 A | | 4/1996 | Kumar et al. |
| 5,537,000 A | * | 7/1996 | Alivisatos et al. ............ 313/506 |
| 6,180,239 B1 | | 1/2001 | Whitesides et al. |
| 6,251,303 B1 | | 6/2001 | Bawendi et al. |
| 6,322,901 B1 | | 11/2001 | Bawendi et al. |
| 6,518,168 B1 | | 2/2003 | Clem et al. |
| 6,576,291 B2 | | 6/2003 | Bawendi et al. |
| 6,797,412 B1 | | 9/2004 | Jain et al. |
| 7,332,211 B1 | | 2/2008 | Bulovic et al. |
| 7,491,642 B2 | * | 2/2009 | Lewis et al. .................... 438/642 |
| 2003/0170927 A1 | * | 9/2003 | Holonyak et al. ............... 438/47 |
| 2004/0023010 A1 | | 2/2004 | Bulovic et al. |
| 2005/0006656 A1 | | 1/2005 | Jain et al. |
| 2005/0116633 A1 | * | 6/2005 | Yamazaki et al. ............ 313/506 |
| 2005/0230673 A1 | | 10/2005 | Mueller et al. |
| 2005/0258418 A1 | | 11/2005 | Steckel et al. |
| 2006/0001066 A1 | * | 1/2006 | Ping et al. ...................... 257/296 |
| 2006/0063029 A1 | * | 3/2006 | Jang et al. ...................... 428/690 |
| 2006/0157720 A1 | | 7/2006 | Bawendi et al. |
| 2006/0196375 A1 | | 9/2006 | Coe-Sullivan et al. |
| 2006/0197695 A1 | * | 9/2006 | Takeuchi et al. .............. 341/155 |

(Continued)

FOREIGN PATENT DOCUMENTS

JP A-2003-217861 7/2003

(Continued)

OTHER PUBLICATIONS

Adachi et al., Appl. Phys. Lett. 78, 1622 (2001).

(Continued)

*Primary Examiner* — Karabi Guharay
(74) *Attorney, Agent, or Firm* — Steptoe & Johnson LLP (57) ABSTRACT

A light emitting device includes a semiconductor nanocrystal and a charge transporting layer that includes an inorganic material. The charge transporting layer can be a hole or electron transporting layer. The inorganic material can be an inorganic semiconductor.

57 Claims, 6 Drawing Sheets

U.S. PATENT DOCUMENTS

| | | | |
|---|---|---|---|
| 2006/0205142 A1* | 9/2006 | Ping et al. | 438/239 |
| 2007/0001581 A1 | 1/2007 | Stasiak et al. | |
| 2007/0057263 A1 | 3/2007 | Kahen | |
| 2007/0170446 A1 | 7/2007 | Cho et al. | |
| 2008/0001167 A1 | 1/2008 | Coe-Sullivan et al. | |
| 2008/0150425 A1 | 6/2008 | Cho et al. | |
| 2009/0039764 A1 | 2/2009 | Cho et al. | |

FOREIGN PATENT DOCUMENTS

| | | |
|---|---|---|
| JP | A-2004-296950 | 10/2004 |
| JP | A-2004-303592 | 10/2004 |
| JP | A-2005-38634 | 2/2005 |
| WO | WO 03/021694 | 3/2003 |

OTHER PUBLICATIONS

Bulovic et al., Semiconductors and Semimetals 64, 255 (2000).
Bulovic, V. et al., *Nature* 1996, 380, 29.
C. R. Kagan, et al., Phys. Rev. Lett, 76, 1517 (1996).
C.R. Kagan, et al., Phys. Rev. B 54, 8633 (1996).
D'Andrade et al., MRS Fall Meeting, BB6.2 (2001).
Dabbousi et al., J. Phys. Chem. 101, 9463 (1997).
Gu, G. et al., *Appl. Phys. Lett.* 1996, 68, 2606-2608.
H. Kuhn and D. Mobius, Angew. Chem. 10, 620 (1971).
H. Morawitz, Phys. Rev. 187, 1792 (1969).
H. Sato, et al., Thin Solid Films 236, 1-2, 27-31 (1993).
I. Larkin, et al., Phys. Rev. B 69, 121403(R) (2004).
K. H. Drexhage, et al., Ber. Bunsenges. Phys. Chem. 70, 1179 (1966).
K. Suga, et al., Sens. Actuators B 14, 598(1993).
P. E. Burrows and S. R. Forrest, Appl. Phys. Lett. 64, 2285 (1994).
P.E Burrows, et al., J. Appl. Phys. 79, 7991 (1996).
R. A. M. Hikmet, et al., J. Appl. Phys. 93, 3509 (2003).
R. R. Chance, et al., J. Chem. Phys. 60, 2744 (1974).
S. Coe-Sullivan, et al., Proc. of SPIE vol. 5739, p. 108 (2005).
W.Y. Lee, et al., Appl. Phys. Lett. 72, 1584 (1998).
Yamasaki et al., Appl. Phys. Lett. 76, 1243 (2000).
U.S Appl. No. 11/959,853, filed Dec. 19, 2007, Bulovic et al.

* cited by examiner

LIGHT EMITTING DEVICES INCLUDING SEMICONDUCTOR NANOCRYSTALS

CLAIM OF PRIORITY

This application claims priority to provisional U.S. application No. 60/653,094, filed Feb. 16, 2005, which is hereby incorporated by reference.

FEDERALLY SPONSORED RESEARCH OR DEVELOPMENT

This invention was made with government support awarded by the National Science Foundation under Grant No. DMR-0213282 and by the Air Force Office of Scientific Research under Grant No. FA9550-04-1-0462. The U.S. Government has certain rights in this invention.

TECHNICAL FIELD

The present invention relates to light emitting devices including semiconductor nanocrystals.

BACKGROUND

Light-emitting devices can be used, for example, in displays (e.g., flat-panel displays), screens (e.g., computer screens), and other items that require illumination. Accordingly, the brightness of the light-emitting device is an important feature of the device. Also, low operating voltages and high efficiencies can improve the viability of producing emissive devices. In many applications, long device lifetime is desirable.

Light-emitting devices can release photons in response to excitation of an active component of the device. Emission can be stimulated by applying a voltage across the active component (e.g., an electroluminescent component) of the device. The electroluminescent component can be a polymer, such as a conjugated organic polymer or a polymer containing electroluminescent moieties or layers of organic molecules. Typically, the emission can occur by radiative recombination of an excited charge between layers of a device. The emitted light has an emission profile that includes a maximum emission wavelength, and an emission intensity, measured in luminance (candelas/square meter ($cd/m^2$) or power flux ($W/m^2$)). The emission profile, and other physical characteristics of the device, can be altered by the electronic structure (e.g., energy gaps) of the material. For example, the brightness, range of color, efficiency, operating voltage, and operating half-lives of light-emitting devices can vary based on the structure of the device.

SUMMARY

In general, a light emitting device can include a plurality of semiconductor nanocrystals. Semiconductor nanocrystals can be inorganic semiconductor particles, for example, 1-15 nm in diameter, optionally decorated with a layer of organic ligands. Nanocrystals can show strong quantum confinement effects that can be harnessed in designing bottom-up chemical approaches to create complex heterostructures with electronic and optical properties that are tunable with the size and composition of the nanocrystals.

Semiconductor nanocrystals can be used as the lumophore in a light emitting device. Because semiconductor nanocrystals can have narrow emission linewidths, can be photoluminescent efficient, and emission wavelength tunable, they can be a desirable lumophore. Semiconductor nanocrystals can be dispersed in a liquid and are therefore compatible with thin-film deposition techniques such as spin-casting, drop-casting, and dip coating. However, bulk semiconductor nanocrystal solids resulting from these deposition techniques have poor electrical transport properties in solid state light emitting devices. Rather than a bulk solid, a monolayer of semiconductor nanocrystals can be used in a light emitting device. A monolayer provides the beneficial light emission properties of semiconductor nanocrystals while minimizing the impact on electrical performance.

Devices using organic materials for the hole transporting or electron transporting layers (or both) can have high efficiency electricity-to-light conversion, but can suffer from short lifetimes due to the inherent instabilities of the organic materials. The inorganic nanocrystals themselves can be inherently more stable than their organic lumophore counterparts, as evidenced by photoluminescence studies. A light emitting device (LED) that utilizes semiconductor nanocrystals for luminescence and inorganic semiconductors for electrical transport can achieve superior optoelectronic performance and long term stability. The inorganic semiconductors can be deposited by a low temperature method, such as sputtering, vacuum vapor deposition, ink jet printing, or ion plating.

Semiconductor nanocrystals can be deposited on a substrate using microcontact printing. Advantageously, microcontact printing allows micron-scale or nano-scale (e.g., less than 1 mm, less than 500 µm, less than 200 µm, less than 100 µm, less than 25 µm, or less than 1 µm) patterning of features on a surface. In particular, a monolayer of semiconductor nanocrystals can be deposited by microcontact printing. This approach can allow a substantially dry (i.e., substantially solvent-free) application of a patterned semiconductor nanocrystal film on a substrate. A wider variety of substrates can thus be used, because the choice of substrate is not constrained by solubility and surface chemistry requirements.

In one aspect, a light emitting device includes a first charge transporting layer including a first inorganic material in contact with a first electrode arranged to introduce charge in the first charge transporting layer, a second electrode, and a plurality of semiconductor nanocrystals disposed between the first electrode and the second electrode. The device can include a second charge transporting layer in contact with the second electrode, where the second electrode is arranged to introduce charge in the second charge transporting layer.

The first inorganic material can be amorphous or polycrystalline. The first inorganic material can include an inorganic semiconductor. The second charge transporting layer can include a second inorganic material. The second inorganic material can be amorphous or polycrystalline. The second inorganic material can be an inorganic semiconductor. The inorganic semiconductor can include a metal chalcogenide. The metal chalcogenide can be a mixed metal chalcogenide. The metal chalcogenide can include a zinc oxide, a titanium oxide, a niobium oxide, a zinc sulfide, an indium tin oxide, or a mixture thereof. The first charge transporting layer can be a hole transporting layer, or the first charge transporting layer can be an electron transporting layer. The plurality of semiconductor nanocrystals can form a monolayer. The plurality of semiconductor nanocrystals can be a substantially monodisperse population of semiconductor nanocrystals. The plurality of semiconductor nanocrystals can be arranged in a pattern. The device can be transparent.

In another aspect, a method of forming a device includes depositing a first charge transport layer including a first inorganic material over an electrode, and depositing of plurality of semiconductor nanocrystals over the electrode, where the plurality of semiconductor nanocrystals is in electrical contact with the first charge transport layer.

Depositing the plurality of semiconductor nanocrystals can include depositing the plurality of semiconductor nanocrystals as a monolayer. Depositing the plurality of semiconductor nanocrystals can include forming a pattern. Depositing the first inorganic material can include sputtering.

The method can include depositing a second charge transport layer including a second inorganic material over the electrode, where the plurality of semiconductor nanocrystals is in electrical contact with the second charge transport layer. Depositing the second inorganic material can include sputtering.

In another aspect, a method of generating light includes providing a device including a first electrode, a second electrode, a first charge transporting layer including a first inorganic material in contact with the first electrode, and a plurality of semiconductor nanocrystals disposed between the first electrode and the second electrode, and applying a light-generating potential across the first electrode and the second electrode.

The device can further include a second charge transporting layer including a second inorganic material.

In another aspect, a display including a plurality of light emitting devices, wherein at least one light emitting device includes a first charge transporting layer including a first inorganic material in contact with a first electrode arranged to introduce charge in the first charge transporting layer, a second electrode, and a plurality of semiconductor nanocrystals disposed between the first electrode and the second electrode.

Other features, objects, and advantages of the invention will be apparent from the description and drawings, and from the claims.

DETAILED DESCRIPTION

A light emitting device can include two layers separating two electrodes of the device. The material of one layer can be chosen based on the material's ability to transport holes, or the hole transporting layer (HTL). The material of the other layer can be chosen based on the material's ability to transport electrons, or the electron transporting layer (ETL). The electron transporting layer typically includes an electroluminescent layer. When a voltage is applied, one electrode injects holes (positive charge carriers) into the hole transporting layer, while the other electrode injects electrons into the electron transporting layer. The injected holes and electrons each migrate toward the oppositely charged electrode. When an electron and hole localize on the same molecule, an exciton is formed, which can recombine to emit light. The device can include an emissive layer between the HTL and the ETL. The emissive layer can include a material selected for its emissive properties, such as emission wavelength or linewidth.

Figure 1:
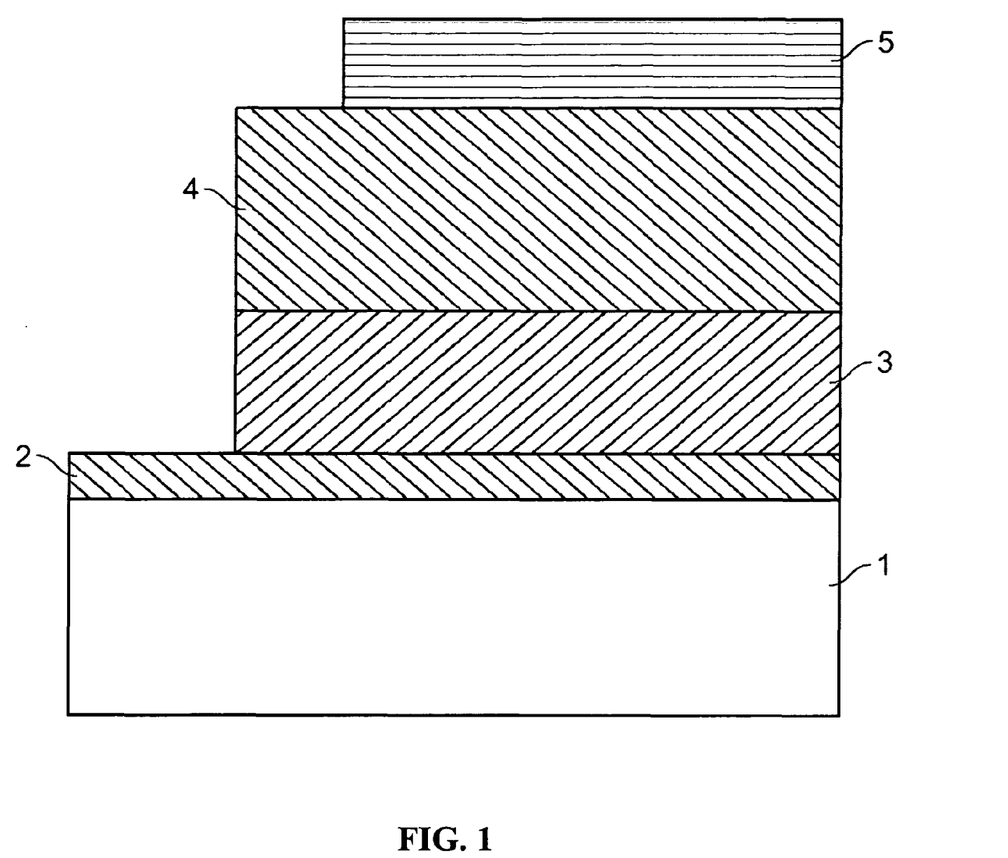
FIG. 1 is a schematic drawing depicting a light-emitting device.

A light emitting device can have a structure such as shown in FIG. 1, in which a first electrode 2, a first layer 3 in contact with the electrode 2, a second layer 4 in contact with the layer 3, and a second electrode 5 in contact with the second layer 4. First layer 3 can be a hole transporting layer and second layer 4 can be an electron transporting layer. At least one layer can be non-polymeric. The layers can include an inorganic material. One of the electrodes of the structure is in contact with a substrate 1. Each electrode can contact a power supply to provide a voltage across the structure. Electroluminescence can be produced by the emissive layer of the heterostructure when a voltage of proper polarity is applied across the heterostructure. First layer 3 can include a plurality of semiconductor nanocrystals, for example, a substantially monodisperse population of nanocrystals. Alternatively, a separate emissive layer (not shown in FIG. 1) can be included between the hole transporting layer and the electron transporting layer. The separate emissive layer can include the plurality of nanocrystals. A layer that includes nanocrystals can be a monolayer of nanocrystals.

Light emitting devices including semiconductor nanocrystals can be made by spin-casting a solution containing the HTL organic semiconductor molecules and the semiconductor nanocrystals, where the HTL formed underneath of the semiconductor nanocrystal monolayer via phase separation (see, for example, U.S. patent application Ser. No. 10/400, 907, filed Mar. 28, 2003, and U.S. Patent Application Publication No. 2004/0023010, each of which is incorporated by reference in its entirety). This phase separation technique reproducibly placed a monolayer of semiconductor nanocrystals between an organic semiconductor HTL and ETL, thereby effectively exploiting the favorable light emission properties of semiconductor nanocrystals, while minimizing their impact on electrical performance. Devices made by this technique were limited by impurities in the solvent, by the necessity to use organic semiconductor molecules that are soluble in the same solvents as the semiconductor nanocrystals. The phase separation technique was unsuitable for depositing a monolayer of semiconductor nanocrystals on top of both a HTL and a HIL (due to the solvent destroying the underlying organic thin film). Nor did the phase separation method allow control of the location of semiconductor nanocrystals that emit different colors on the same substrate; nor patterning of the different color emitting nanocrystals on that same substrate.

Moreover, the organic materials used in the transport layers (i.e., hole transport, hole injection, or electron transport layers) can be less stable than the semiconductor nanocrystals used in the emissive layer. As a result, the operational life of the organic materials limits the life of the device. A device with longer-lived materials in the transport layers can be used to form a longer-lasting light emitting device.

The substrate can be opaque or transparent. A transparent substrate can be used to in the manufacture of a transparent LED. See, for example, Bulovic, V. et al., *Nature* 1996, 380, 29; and Gu, G. et al., *Appl. Phys. Lett.* 1996, 68, 2606-2608, each of which is incorporated by reference in its entirety. Transparent LEDs can be used in applications such as a head-up display, as on a helmet visor or a vehicle windscreen. The substrate can be rigid or flexible. The substrate can be plastic, metal or glass. The first electrode can be, for example, a high work function hole-injecting conductor, such as an indium tin oxide (ITO) layer. Other first electrode materials can include gallium indium tin oxide, zinc indium tin oxide, titanium nitride, or polyaniline. The second electrode can be, for example, a low work function (e.g., less than 4.0 eV), electron-injecting, metal, such as Al, Ba, Yb, Ca, a lithium-aluminum alloy (Li:Al), or a magnesium-silver alloy (Mg:Ag). The second electrode, such as Mg:Ag, can be covered with an opaque protective metal layer, for example, a layer of Ag for protecting the cathode layer from atmospheric oxidation, or a relatively thin layer of substantially transparent ITO. The first electrode can have a thickness of about 500 Angstroms to 4000 Angstroms. The first layer can have a thickness of about 50 Angstroms to about 5 micrometers, such as a thickness in the range of 100 Angstroms to 100 nm, 100 nm to 1 micrometer, or 1 micrometer to 5 micrometers. The second layer can have a thickness of about 50 Angstroms to about 5 micrometers, such as a thickness in the range of 100 Angstroms to 100 nm, 100 nm to 1 micrometer, or 1 micrometer to 5 micrometers. The second electrode can have a thickness of about 50 Angstroms to greater than about 1000 Angstroms.

A hole transporting layer (HTL) or an electron transporting layer (ETL) can include an inorganic material, such as an inorganic semiconductor. The inorganic semiconductor can be any material with a band gap greater than the emission energy of the emissive material. The inorganic semiconductor can include a metal chalcogenide, metal pnictide, or elemental semiconductor, such as a metal oxide, a metal sulfide, a metal selenide, a metal telluride, a metal nitride, a metal phosphide, a metal arsenide, or metal arsenide. For example, the inorganic material can include zinc oxide, a titanium oxide, a niobium oxide, an indium tin oxide, copper oxide, nickel oxide, vanadium oxide, chromium oxide, indium oxide, tin oxide, gallium oxide, manganese oxide, iron oxide, cobalt oxide, aluminum oxide, thallium oxide, silicon oxide, germanium oxide, lead oxide, zirconium oxide, molybdenum oxide, hafnium oxide, tantalum oxide, tungsten oxide, cadmium oxide, iridium oxide, rhodium oxide, ruthenium oxide, osmium oxide, a zinc sulfide, zinc selenide, zinc telluride, cadmium sulfide, cadmium selenide, cadmium telluride, mercury sulfide, mercury selenide, mercury telluride, silicon carbide, diamond (carbon), silicon, germanium, aluminum nitride, aluminum phosphide, aluminum arsenide, aluminum antimonide, gallium nitride, gallium phosphide, gallium arsenide, gallium antimonide, indium nitride, indium phosphide, indium arsenide, indium antimonide, thallium nitride, thallium phosphide, thallium arsenide, thallium antimonide, lead sulfide, lead selenide, lead telluride, iron sulfide, indium selenide, indium sulfide, indium telluride, gallium sulfide, gallium selenide, gallium telluride, tin selenide, tin telluride, tin sulfide, magnesium sulfide, magnesium selenide, magnesium telluride, or a mixture thereof. The metal oxide can be a mixed metal oxide, such as, for example, ITO. In a device, a layer of pure metal oxide (i.e., a metal oxide with a single substantially pure metal) can develop crystalline regions over time degrading the performance of the device. A mixed metal oxide can be less prone to forming such crystalline regions, providing longer device lifetimes than available with pure metal oxides. The metal oxide can be a doped metal oxide, where the doping is, for example, an oxygen deficiency, a halogen dopant, or a mixed metal. The inorganic semiconductor can include a dopant. In general, the dopant can be a p-type or an n-type dopant. An HTL can include a p-type dopant, whereas an ETL can include an n-type dopant.

Single crystalline inorganic semiconductors have been proposed for charge transport to semiconductor nanocrystals in LEDs. Single crystalline inorganic semiconductors are deposited by techniques that require heating the substrate to be coated to a high temperature. However, the top layer semiconductors must be deposited directly onto the nanocrystal layer, which is not robust to high temperature processes, nor suitable for facile epitaxial growth. Epitaxial techniques (such as chemical vapor deposition) can also be costly to manufacture, and generally cannot be used to cover a large area, (i.e., larger than a 12 inch diameter wafer).

Advantageously, the inorganic semiconductor can be deposited on a substrate at a low temperature, for example, by sputtering. Sputtering is performed by applying a high voltage across a low-pressure gas (for example, argon) to create a plasma of electrons and gas ions in a high-energy state. Energized plasma ions strike a target of the desired coating material, causing atoms from that target to be ejected with enough energy to travel to, and bond with, the substrate.

The substrate or a the device being manufactured is cooled or heated for temperature control during the growth process. The temperature affects the crystallinity of the deposited material as well as how it interacts with the surface it is being deposited upon. The deposited material can be polycrystalline or amorphous. The deposited material can have crystalline domains with a size in the range of 10 Angstroms to 1 micrometer. Doping concentration can be controlled by varying the gas, or mixture of gases, which is used for the sputtering plasma. The nature and extent of doping can influence the conductivity of the deposited film, as well as its ability to optically quench neighboring excitons. By growing one material on top of another, p-n or p-i-n diodes can be created. The device can be optimized for delivery of charge to a semiconductor nanocrystal monolayer.

The layers can be deposited on a surface of one of the electrodes by spin coating, dip coating, vapor deposition, sputtering, or other thin film deposition methods. The second electrode can be sandwiched, sputtered, or evaporated onto the exposed surface of the solid layer. One or both of the electrodes can be patterned. The electrodes of the device can be connected to a voltage source by electrically conductive pathways. Upon application of the voltage, light is generated from the device.

Microcontact printing provides a method for applying a material to a predefined region on a substrate. The predefined region is a region on the substrate where the material is selectively applied. The material and substrate can be chosen such that the material remains substantially entirely within the predetermined area. By selecting a predefined region that forms a pattern, material can be applied to the substrate such that the material forms a pattern. The pattern can be a regular pattern (such as an array, or a series of lines), or an irregular pattern. Once a pattern of material is formed on the substrate, the substrate can have a region including the material (the predefined region) and a region substantially free of material. In some circumstances, the material forms a monolayer on the substrate. The predefined region can be a discontinuous region. In other words, when the material is applied to the predefined region of the substrate, locations including the material can be separated by other locations that are substantially free of the material.

In general, microcontact printing begins by forming a patterned mold. The mold has a surface with a pattern of elevations and depressions. A stamp is formed with a complementary pattern of elevations and depressions, for example by coating the patterned surface of the mold with a liquid polymer precursor that is cured while in contact with the patterned mold surface. The stamp can then be inked; that is, the stamp is contacted with a material which is to be deposited on a substrate. The material becomes reversibly adhered to the stamp. The inked stamp is then contacted with the substrate. The elevated regions of the stamp can contact the substrate while the depressed regions of the stamp can be separated from the substrate. Where the inked stamp contacts the substrate, the ink material (or at least a portion thereof) is transferred from the stamp to the substrate. In this way, the pattern of elevations and depressions is transferred from the stamp to the substrate as regions including the material and free of the material on the substrate. Microcontact printing and related techniques are described in, for example, U.S. Pat. Nos. 5,512,131; 6,180,239; and 6,518,168, each of which is incorporated by reference in its entirety. In some circumstances, the stamp can be a featureless stamp having a pattern of ink, where the pattern is formed when the ink is applied to the stamp. See U.S. patent application Ser. No. 11/253,612, filed Oct. 21, 2005, which is incorporated by reference in its entirety.

Figure 2:
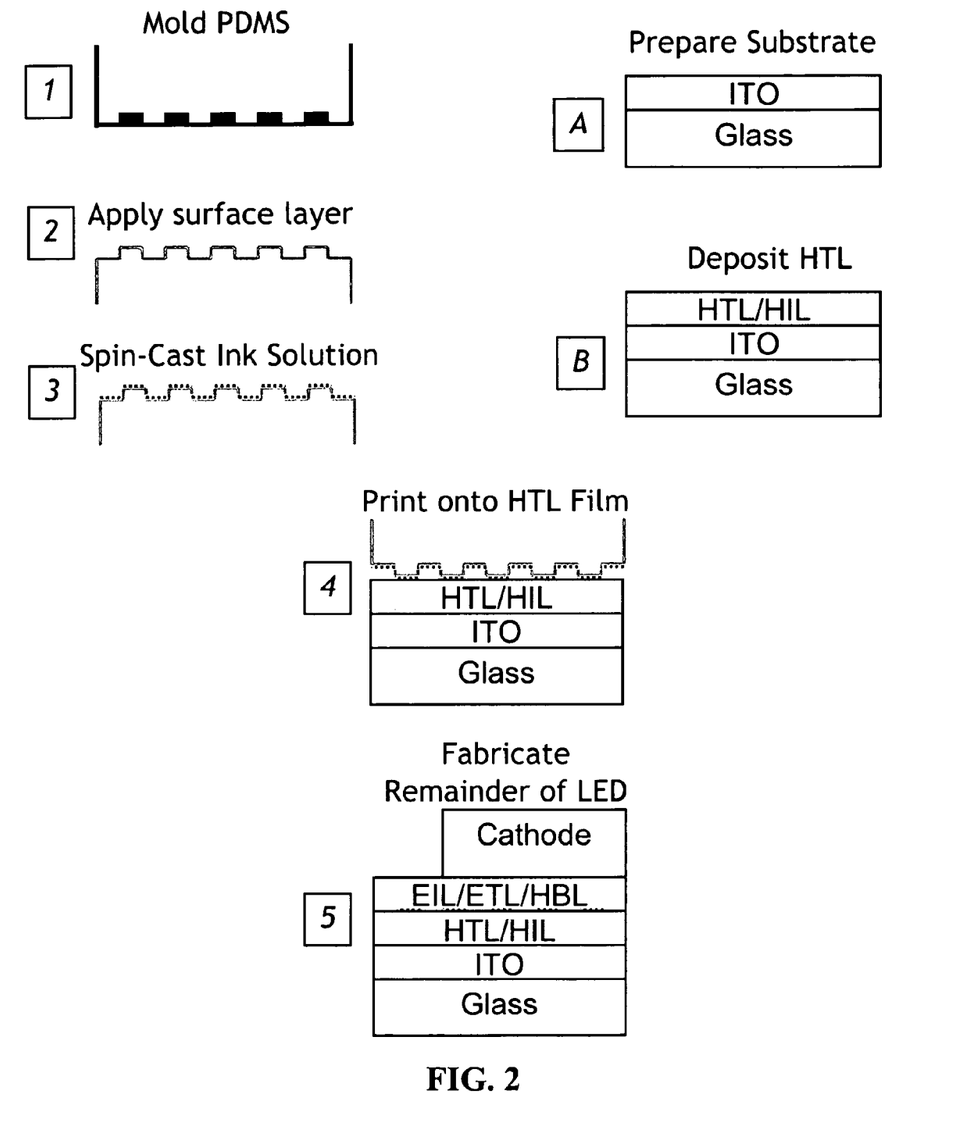
FIG. 2 is a diagram depicting a method of forming a light-emitting device.

FIG. 2 depicts a flow chart outlining the basic steps in the microcontact printing process. First, a silicon master is made using standard semiconductor processing techniques which define a pattern on the silicon surface, for example a pattern of elevations and depressions (alternatively, for a non-patterned deposition, a blank Si master can be used). Poly dimethyl siloxane (PDMS, for example Sylgard 184) precursors are then mixed, degassed, poured onto the master, and degassed again, and allowed to cure at room temperature (or above room temperature, for faster cure times) (step 1). The PDMS stamp, having a surface including the pattern of the silicon master, is then freed from the master, and cut into the desired shape and size. This stamp is then coated with a surface chemistry layer, selected to readily adhere and release the ink as needed. For example, the surface chemistry layer can be a chemical vapor deposited Parylene-C layer. The surface chemistry layer can be, for example, 0.1 to 2 µm thick, depending on the pattern to be reproduced (step 2). This stamp is then inked, for example by spin-casting, syringe pump dispensing, or ink jet printing a solution of semiconductor nanocrystals (step 3). The solution can have, for example, a concentration of 1-10 mg/mL in chloroform. The concentration can be varied depending on desired outcome. The inked stamp can then be contacted to a substrate, and gentle pressure applied for, for example, 30 seconds to transfer the ink (i.e., a semiconductor nanocrystal monolayer) completely to the new substrate (step 4). FIGS. 2A and 2B depict the preparation of an ITO coated glass substrate. A hole transport and/or a hole injection layer (HTL and HIL, respectively) including organic semiconductor is thermally evaporated onto the ITO substrate. The patterned semiconductor nanocrystal monolayer is transferred to this HTL layer, and the rest of the device (e.g., electron transport layer (ETL), electron injection layer (EIL), and metal contacts) can then be added (step 5). See, for example, U.S. patent application Ser. Nos. 11/253,595, and 11/253,612, both filed Oct. 21, 2005, and 11/032,163, filed Jan. 11, 2005, each of which is incorporated by reference in its entirety.

When the electron and hole localize on a nanocrystal, emission can occur at an emission wavelength. The emission has a frequency that corresponds to the band gap of the quantum confined semiconductor material. The band gap is a function of the size of the nanocrystal. Nanocrystals having small diameters can have properties intermediate between molecular and bulk forms of matter. For example, nanocrystals based on semiconductor materials having small diameters can exhibit quantum confinement of both the electron and hole in all three dimensions, which leads to an increase in the effective band gap of the material with decreasing crystallite size. Consequently, both the optical absorption and emission of nanocrystals shift to the blue, or to higher energies, as the size of the crystallites decreases.

The emission from the nanocrystal can be a narrow Gaussian emission band that can be tuned through the complete wavelength range of the ultraviolet, visible, or infrared regions of the spectrum by varying the size of the nanocrystal, the composition of the nanocrystal, or both. For example, CdSe can be tuned in the visible region and InAs can be tuned in the infrared region. The narrow size distribution of a population of nanocrystals can result in emission of light in a narrow spectral range. The population can be monodisperse and can exhibit less than a 15% rms deviation in diameter of the nanocrystals, preferably less than 10%, more preferably less than 5%. Spectral emissions in a narrow range of no greater than about 75 nm, preferably 60 nm, more preferably 40 nm, and most preferably 30 nm full width at half max (FWHM) for nanocrystals that emit in the visible can be observed. IR-emitting nanocrystals can have a FWHM of no greater than 150 nm, or no greater than 100 nm. Expressed in terms of the energy of the emission, the emission can have a FWHM of no greater than 0.05 eV, or no greater than 0.03 eV. The breadth of the emission decreases as the dispersity of nanocrystal diameters decreases. Semiconductor nanocrystals can have high emission quantum efficiencies such as greater than 10%, 20%, 30%, 40%, 50%, 60%, 70%, or 80%.

The semiconductor forming the nanocrystals can include a Group II-VI compound, a Group II-V compound, a Group III-VI compound, a Group III-V compound, a Group IV-VI compound, a Group I-III-VI compound, a Group II-IV-VI compound, or a Group II-IV-V compound, for example, ZnO, ZnS, ZnSe, ZnTe, CdO, CdS, CdSe, CdTe, MgO, MgS, MgSe, MgTe, HgO, HgS, HgSe, HgTe, AlN, AlP, AlAs, AlSb, GaN, GaP, GaAs, GaSb, InN, InP, InAs, InSb, TlN, TlP, TlAs, TlSb, TlSb, PbS, PbSe, PbTe, or mixtures thereof.

Methods of preparing monodisperse semiconductor nanocrystals include pyrolysis of organometallic reagents, such as dimethyl cadmium, injected into a hot, coordinating solvent. This permits discrete nucleation and results in the controlled growth of macroscopic quantities of nanocrystals. Preparation and manipulation of nanocrystals are described, for example, in U.S. Pat. Nos. 6,322,901 and 6,576,291, and U.S. patent application No. 60/550,314, each of which is incorporated by reference in its entirety. The method of manufacturing a nanocrystal is a colloidal growth process. Colloidal growth occurs by rapidly injecting an M donor and an X donor into a hot coordinating solvent. The injection produces a nucleus that can be grown in a controlled manner to form a nanocrystal. The reaction mixture can be gently heated to grow and anneal the nanocrystal. Both the average size and the size distribution of the nanocrystals in a sample are dependent on the growth temperature. The growth temperature necessary to maintain steady growth increases with increasing average crystal size. The nanocrystal is a member of a population of nanocrystals. As a result of the discrete nucleation and controlled growth, the population of nanocrystals obtained has a narrow, monodisperse distribution of diameters. The monodisperse distribution of diameters can also be referred to as a size. The process of controlled growth and annealing of the nanocrystals in the coordinating solvent that follows nucleation can also result in uniform surface derivatization and regular core structures. As the size distribution sharpens, the temperature can be raised to maintain steady growth. By adding more M donor or X donor, the growth period can be shortened.

The M donor can be an inorganic compound, an organometallic compound, or elemental metal. M is cadmium, zinc, magnesium, mercury, aluminum, gallium, indium or thallium. The X donor is a compound capable of reacting with the M donor to form a material with the general formula MX.

Typically, the X donor is a chalcogenide donor or a pnictide donor, such as a phosphine chalcogenide, a bis(silyl) chalcogenide, dioxygen, an ammonium salt, or a tris(silyl) pnictide. Suitable X donors include dioxygen, bis(trimethylsilyl) selenide ((TMS)$_2$Se), trialkyl phosphine selenides such as (tri-n-octylphosphine) selenide (TOPSe) or (tri-n-butylphosphine) selenide (TBPSe), trialkyl phosphine tellurides such as (tri-n-octylphosphine) telluride (TOPTe) or hexapropylphosphorustriamide telluride (HPPTTe), bis(trimethylsilyl)telluride ((TMS)$_2$Te), bis(trimethylsilyl)sulfide ((TMS)$_2$S), a trialkyl phosphine sulfide such as (tri-n-octylphosphine) sulfide (TOPS), an ammonium salt such as an ammonium halide (e.g., NH$_4$Cl), tris(trimethylsilyl) phosphide ((TMS)$_3$P), tris(trimethylsilyl) arsenide ((TMS)$_3$As), or tris(trimethylsilyl) antimonide ((TMS)$_3$Sb). In certain embodiments, the M donor and the X donor can be moieties within the same molecule.

A coordinating solvent can help control the growth of the nanocrystal. The coordinating solvent is a compound having a donor lone pair that, for example, has a lone electron pair available to coordinate to a surface of the growing nanocrystal. Solvent coordination can stabilize the growing nanocrystal. Typical coordinating solvents include alkyl phosphines, alkyl phosphine oxides, alkyl phosphonic acids, or alkyl phosphinic acids, however, other coordinating solvents, such as pyridines, furans, and amines may also be suitable for the nanocrystal production. Examples of suitable coordinating solvents include pyridine, tri-n-octyl phosphine (TOP), tri-n-octyl phosphine oxide (TOPO) and tris-hydroxylpropylphosphine (tHPP). Technical grade TOPO can be used.

Size distribution during the growth stage of the reaction can be estimated by monitoring the absorption line widths of the particles. Modification of the reaction temperature in response to changes in the absorption spectrum of the particles allows the maintenance of a sharp particle size distribution during growth. Reactants can be added to the nucleation solution during crystal growth to grow larger crystals. By stopping growth at a particular nanocrystal average diameter and choosing the proper composition of the semiconducting material, the emission spectra of the nanocrystals can be tuned continuously over the wavelength range of 300 nm to 5 microns, or from 400 nm to 800 nm for CdSe and CdTe. The nanocrystal has a diameter of less than 150 Å. A population of nanocrystals has average diameters in the range of 15 Å to 125 Å.

The nanocrystal can be a member of a population of nanocrystals having a narrow size distribution. The nanocrystal can be a sphere, rod, disk, or other shape. The nanocrystal can include a core of a semiconductor material. The nanocrystal can include a core having the formula MX, where M is cadmium, zinc, magnesium, mercury, aluminum, gallium, indium, thallium, or mixtures thereof, and X is oxygen, sulfur, selenium, tellurium, nitrogen, phosphorus, arsenic, antimony, or mixtures thereof.

The core can have an overcoating on a surface of the core. The overcoating can be a semiconductor material having a composition different from the composition of the core. The overcoat of a semiconductor material on a surface of the nanocrystal can include a Group II-VI compound, a Group II-V compound, a Group III-VI compound, a Group III-V compound, a Group IV-VI compound, a Group I-III-VI compound, a Group II-IV-VI compound, and a Group II-IV-V compound, for example, ZnO, ZnS, ZnSe, ZnTe, CdO, CdS, CdSe, CdTe, MgO, MgS, MgSe, MgTe, HgO, HgS, HgSe, HgTe, AlN, AlP, AlAs, AlSb, GaN, GaP, GaAs, GaSb, InN, InP, InAs, InSb, TlN, TlP, TlAs, TlSb, TlSb, PbS, PbSe, PbTe, or mixtures thereof. For example, ZnS, ZnSe or CdS overcoatings can be grown on CdSe or CdTe nanocrystals. An overcoating process is described, for example, in U.S. Pat. No. 6,322,901. By adjusting the temperature of the reaction mixture during overcoating and monitoring the absorption spectrum of the core, over coated materials having high emission quantum efficiencies and narrow size distributions can be obtained. The overcoating can be between 1 and 10 monolayers thick.

The particle size distribution can be further refined by size selective precipitation with a poor solvent for the nanocrystals, such as methanol/butanol as described in U.S. Pat. No. 6,322,901. For example, nanocrystals can be dispersed in a solution of 10% butanol in hexane. Methanol can be added dropwise to this stirring solution until opalescence persists. Separation of supernatant and flocculate by centrifugation produces a precipitate enriched with the largest crystallites in the sample. This procedure can be repeated until no further sharpening of the optical absorption spectrum is noted. Size-selective precipitation can be carried out in a variety of solvent/nonsolvent pairs, including pyridine/hexane and chloroform/methanol. The size-selected nanocrystal population can have no more than a 15% rms deviation from mean diameter, preferably 10% rms deviation or less, and more preferably 5% rms deviation or less.

The outer surface of the nanocrystal can include compounds derived from the coordinating solvent used during the growth process. The surface can be modified by repeated exposure to an excess of a competing coordinating group. For example, a dispersion of the capped nanocrystal can be treated with a coordinating organic compound, such as pyridine, to produce crystallites which disperse readily in pyridine, methanol, and aromatics but no longer disperse in aliphatic solvents. Such a surface exchange process can be carried out with any compound capable of coordinating to or bonding with the outer surface of the nanocrystal, including, for example, phosphines, thiols, amines and phosphates. The nanocrystal can be exposed to short chain polymers which exhibit an affinity for the surface and which terminate in a moiety having an affinity for a suspension or dispersion medium. Such affinity improves the stability of the suspension and discourages flocculation of the nanocrystal. Nanocrystal coordinating compounds are described, for example, in U.S. Pat. No. 6,251,303, which is incorporated by reference in its entirety.

More specifically, the coordinating ligand can have the formula:

wherein k is 2, 3 or 5, and n is 1, 2, 3, 4 or 5 such that k-n is not less than zero; X is O, S, S=O, SO$_2$, Se, Se=O, N, N=O, P, P=O, As, or As=O; each of Y and L, independently, is aryl, heteroaryl, or a straight or branched C$_{2-12}$ hydrocarbon chain optionally containing at least one double bond, at least one triple bond, or at least one double bond and one triple bond. The hydrocarbon chain can be optionally substituted with one or more C$_{1-4}$ alkyl, C$_{2-4}$ alkenyl, C$_{2-4}$ alkynyl, C$_{1-4}$ alkoxy, hydroxyl, halo, amino, nitro, cyano, C$_{3-5}$ cycloalkyl, 3-5 membered heterocycloalkyl, aryl, heteroaryl, C$_{1-4}$ alkylcarbonyloxy, C$_{1-4}$ alkyloxycarbonyl, C$_{1-4}$ alkylcarbonyl, or formyl. The hydrocarbon chain can also be optionally interrupted by —O—, —S—, —N(R$^a$)—, —N(R$^a$)—C(O)—O—, —O—C(O)—N(R$^a$)—, —N(R$^a$)—C(O)—N(R$^b$)—, —O—C(O)—O—, —P(R$^a$)—, or —P(O)(R$^a$)—. Each of R$^a$ and R$^b$, independently, is hydrogen, alkyl, alkenyl, alkynyl, alkoxy, hydroxylalkyl, hydroxyl, or haloalkyl.

An aryl group is a substituted or unsubstituted cyclic aromatic group. Examples include phenyl, benzyl, naphthyl, tolyl, anthracyl, nitrophenyl, or halophenyl. A heteroaryl group is an aryl group with one or more heteroatoms in the ring, for instance furyl, pyiridyl, pyrrolyl, phenanthryl.

A suitable coordinating ligand can be purchased commercially or prepared by ordinary synthetic organic techniques, for example, as described in J. March, *Advanced Organic Chemistry*, which is incorporated by reference in its entirety.

Transmission electron microscopy (TEM) can provide information about the size, shape, and distribution of the nanocrystal population. Powder X-ray diffraction (XRD) patterns can provide the most complete information regarding the type and quality of the crystal structure of the nanocrystals. Estimates of size are also possible since particle diameter is inversely related, via the X-ray coherence length, to the peak width. For example, the diameter of the nanocrystal can be measured directly by transmission electron microscopy or estimated from X-ray diffraction data using, for example, the Scherrer equation. It also can be estimated from the UV/Vis absorption spectrum.

Individual devices can be formed at multiple locations on a single substrate to form a display. The display can include devices that emit at different wavelengths. By patterning the substrate with arrays of different color-emitting materials, a display including pixels of different colors can be formed. In some applications, the substrate can include a backplane. The backplane includes active or passive electronics for controlling or switching power to individual pixels. Include a backplane can be useful for applications such as displays, sensors, or imagers. In particular, the backplane can be configured as an active matrix, passive matrix, fixed format, directly drive, or hybrid. The display can be configured for still images, moving images, or lighting. A lighting display can provide white light, monochrome light, or color-tunable light. See, e.g., U.S. patent application Ser. No. 11/253,612, filed Oct. 21, 2005, which is incorporated by reference in its entirety.

The device can be made in a controlled (oxygen-free and moisture-free) environment, preventing the quenching of luminescent efficiency during the fabrication process. Other multilayer structures may be used to improve the device performance (see, for example, U.S. patent application Ser. Nos. 10/400,907 and 10/400,908, filed Mar. 28, 2003, each of which is incorporated by reference in its entirety). A blocking layer, such as an electron blocking layer (EBL), a hole blocking layer (HBL) or a hole and electron blocking layer (eBL), can be introduced in the structure. A blocking layer can include 3-(4-biphenylyl)-4-phenyl-5-tert-butylphenyl-1,2,4-triazole (TAZ), 3,4,5-triphenyl-1,2,4-triazole, 3,5-bis(4-tert-butylphenyl)-4-phenyl-1,2,4-triazo, bathocuproine (BCP), 4,4',4"-tris {N-(3-methylphenyl)-N-phenylamino}triphenylamine (m-MTDATA), polyethylene dioxythiophene (PEDOT), 1,3-bis(5-(4-diphenylamino)phenyl-1,3,4-oxadiazol-2-yl)benzene, 2-(4-biphenylyl)-5-(4-tert-butylphenyl)-1,3,4-oxadiazole, 1,3-bis[5-(4-(1,1-dimethylethyl)phenyl)-1,3,4-oxadiazol-2-yl]benzene, 1,4-bis(5-(4-diphenylamino)phenyl-1,3,4-oxadiazol-2-yl)benzene, or 1,3,5-tris [5-(4-(1,1-dimethylethyl)phenyl)-1,3,4-oxadiazol-2-yl]benzene.

The performance of light emitting devices can be improved by increasing their efficiency, narrowing or broadening their emission spectra, or polarizing their emission. See, for example, Bulovic et al., Semiconductors and Semimetals 64, 255 (2000), Adachi et al., Appl. Phys. Lett. 78, 1622 (2001), Yamasaki et al., Appl. Phys. Lett. 76, 1243 (2000), Dirr et al., Jpn. J. Appl. Phys. 37, 1457 (1998), and D'Andrade et al., MRS Fall Meeting, BB6.2 (2001), each of which is incorporated herein by reference in its entirety. Nanocrystals can be included in efficient hybrid organic/inorganic light emitting devices.

The narrow FWHM of nanocrystals can result in saturated color emission. This can lead to efficient nanocrystal-light emitting devices even in the red and blue parts of the visible spectrum, since in nanocrystal emitting devices no photons are lost to infrared and UV emission. The broadly tunable, saturated color emission over the entire visible spectrum of a single material system is unmatched by any class of organic chromophores (see, for example, Dabbousi et al., J. Phys. Chem. 101, 9463 (1997), which is incorporated by reference in its entirety). A monodisperse population of nanocrystals will emit light spanning a narrow range of wavelengths. A device including more than one size of nanocrystal can emit light in more than one narrow range of wavelengths. The color of emitted light perceived by a viewer can be controlled by selecting appropriate combinations of nanocrystal sizes and materials in the device. The degeneracy of the band edge energy levels of nanocrystals facilitates capture and radiative recombination of all possible excitons, whether generated by direct charge injection or energy transfer. The maximum theoretical nanocrystal-light emitting device efficiencies are therefore comparable to the unity efficiency of phosphorescent organic light emitting devices. The excited state lifetime ($\tau$) of the nanocrystal is much shorter ($\tau \sim 10$ ns) than a typical phosphor ($\tau > 0.5$ µs), enabling nanocrystal-light emitting devices to operate efficiently even at high current density.

Devices can be prepared that emit visible or infrared light. The size and material of a semiconductor nanocrystal can be selected such that the nanocrystal emits visible or infrared light of a selected wavelength. The wavelength can be between 300 and 2,500 nm or greater, for instance between 300 and 400 nm, between 400 and 700 nm, between 700 and 1100 nm, between 1100 and 2500 nm, or greater than 2500 nm.

Individual devices can be formed at multiple locations on a single substrate to form a display. The display can include devices that emit at different wavelengths. By patterning the substrate with arrays of different color-emitting semiconductor nanocrystals, a display including pixels of different colors can be formed.

To form a device, a p-type semiconductor such as, for example, NiO is deposited on a transparent electrode such as indium time oxide (ITO). The transparent electrode can be arranged on a transparent substrate. Then, semiconductor nanocrystals are deposited using a large-area compatible, single monolayer deposition technique such as micro-contact printing or a Langmuir-Blodgett (LB) technique. Subsequently, an n-type semiconductor (e.g., ZnO or $TiO_2$) is applied, for example by sputtering, on top of this layer. A metal electrode can be thermally evaporated over this to complete the device. More complicated device structures are also possible. For example, a lightly doped layer can be included proximal to the nanocrystal layer, to minimize non-radiative losses due to exciton quenching by unbound charge carriers in the transport layers.

The device can be assembled by separately growing the two transport layers, and physically applying the electrical contacts using an elastomer such as polydimethylsiloxane (PDMS). This avoids the need for direct deposition of material on the nanocrystal layer.

The device can be thermally treated after application of all of the transport layers. The thermal treatment can further enhance injection of charges into the nanocrystals, as well as eliminate the organic capping groups on the nanocrystals. The instability of the capping groups can contribute to device instability.

The inorganic transport layers used, in particular metal-oxide materials can act as barrier layers to prevent $O_2$ and $H_2O$ from entering active layer of the device (the semiconductor nanocrystal layer). The protective nature of the inorganic layer can provide design alternatives to the packaging. For example, because the inorganic layer can be a barrier to water and/or oxygen, the device can be built without the need for additional components to block such contaminants from reaching the emissive material. Encapsulant coatings such as BARIX (made by Vitex) are made using alternating layers of metal oxides and polymers. In such barriers, the metal oxides are the barriers to $O_2$ and $H_2O$, and the polymer layers randomize the occurrences of pin hole defects in the metal oxide layers. Thus, in using the metal oxides as transport layers, the device itself functions as a protective layer to the semiconductor nanocrystals.

Figure 3A:
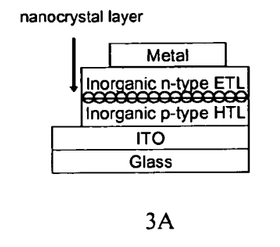
FIGS. 3A-3E are schematic drawings depicting light-emitting devices.
Figure 3B:
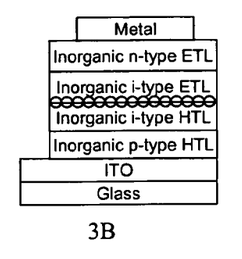
Figure 3C:
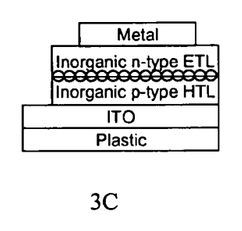
Figure 3D:
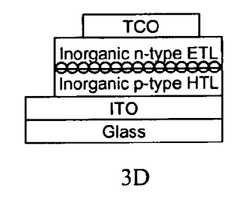
Figure 3E:
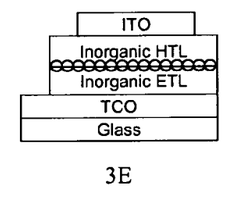

FIGS. 3A-3E show possible device structures. They are a standard p-n diode design (FIG. 3A), a p-i-n diode design (FIG. 3B), a transparent device (FIG. 3C), an inverted device (FIG. 3D, for optimization of contact by thin film transistor (TFT) technologies), and a flexible device (FIG. 3E). In the case of the flexible device, it is possible to incorporate slippage layers, i.e. metal oxide/metal/metal oxide type three layer structures, for each single layer metal oxide layer. This has been shown to increase the flexibility of metal oxide thin films, increasing conductivity, while maintaining transparency. This is because the metal layers, typically silver, are very thin (roughly 12 nm each) and therefore do not absorb much light. In this way, conformable, and perhaps even flexible displays will be realizable using this technology.

The devices can have inherently lower voltages than devices prepared with organic transport materials, due to the high conductivity of the doped inorganic semiconductors. They also have increased electroluminescent lifetimes because the device includes inorganic lumophores and transport layers. Epitaxially manufactured inorganic LEDs have laboratory lifetimes in excess of 100,000 hours, though their lifetime in the field can be limited due to driver failure, or failure of the wire bonded contacts. Finally, because the devices operate exclusively by direct injection of carriers into nanocrystals, both singlets and triplets will be effectively converted into luminescent excitons. The devices can therefore be more efficient by as much as a factor of four.

EXAMPLES

Figure 4A:
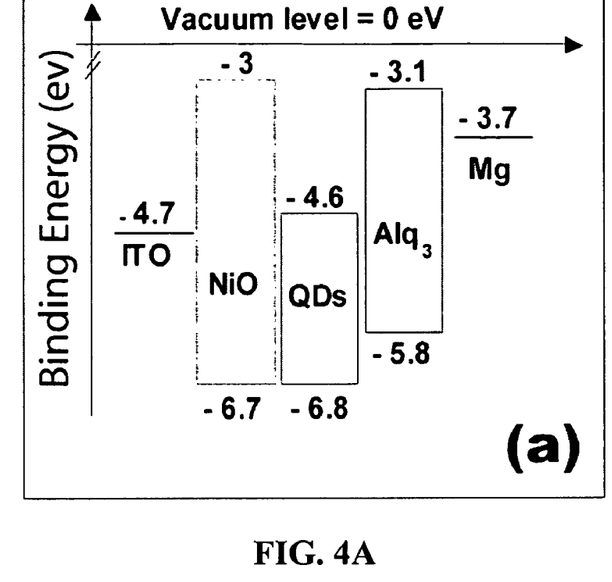
FIG. 4A is a schematic energy diagram of a light emitting device.

LEDs were prepared where the organic TPD film was replaced by a high band gap (>3 eV) inorganic hole-transporting layer that was chemically and electrically more stable. NiO was selected based on band-offset considerations (relative to CdSe nanocrystals), ease of deposition, and its chemical compatibility with the CdSe nanocrystals. Additionally, early studies have shown that transparent p-type NiO thin films can be obtained by near room-temperature reactive sputtering of NiO or Ni targets and can be used as hole-transporting/injecting layers in electro-optical devices. See, for example, H. Sato, et al., Thin Solid Films 236, 1-2 (1993); K. Suga, et al., Sens. Actuators B 14, 598(1993); and W. Y. Lee, et al., Appl. Phys. Lett. 72, 1584 (1998); each of which is incorporated by reference in its entirety. The band structure of the LED device investigated is illustrated in FIG. 4A with the NiO hole transporting layer and $Alq_3$ electron transporting layer sandwiching the nanocrystal lumophores.

The quenching of the nanocrystal monolayer luminescence by the high density of the free charge carriers in NiO was a fundamental photophysical challenge to be overcome in order to build efficient NiO QD-LEDs. This problem was addressed by observing that photoluminescence efficiency of single nanocrystal deposited on top of a resistive ($\rho \approx 1$ $\Omega \cdot cm$) NiO or ITO thin films remained high, in contrast to quenched luminescence of nanocrystals deposited on top of a highly conductive ($\rho \approx 5 \times 10^{-4}$ $\Omega \cdot cm$) NiO and ITO films. This observation was consistent with early theoretical and experimental works which demonstrated that photoluminescence quenching of organic and inorganic lumophores by a dielectric can be tuned by controlling the chromophore-dielectric distance and by tuning the electrical permittivity of the dielectric, which in these devices changed with the hole density in the NiO layer. See, e.g., K. H. Drexhage, et al., Ber. Bunsenges. Phys. Chem. 70, 1179 (1966); H. Kuhn and D. Mobius, Angew. Chem. 10, 620 (1971); R. R. Chance, et al., J. Chem. Phys. 60, 2744 (1974); I. Larkin, et al., Phys. Rev. B 69, 121403(R) (2004); and H. Morawitz, Phys. Rev. 187, 1792 (1969); each of which is incorporated by reference in its entirety.

The LEDs were fabricated as follows. Prior to the deposition of the NiO thin films, ITO precoated glass substrates (with sheet resistance of 30$\Omega$/□ (ohms per square)) were cleaned via sequential ultrasonic rinses in detergent solution, deionized water, and acetone, then boiled in isopropanol for five minutes. After cleaning, substrates were dried in nitrogen and exposed to UV-ozone to eliminate any adsorbed organic materials. Substrates were then inserted into a nitrogen glove box, which was connected to a sputtering and evaporation chamber via a high vacuum transfer line. In the sputtering chamber, a 30 nm thick NiO thin film was deposited by reactive RF magnetron sputtering of a NiO target in an $Ar/O_2$ gas mixture. The base pressure before sputtering was $10^{-7}$ Torr, the RF power was fixed at 200 W, the plasma pressure was 6 mTorr and the ratio between the $O_2$ and Ar gas flow rates was 2.5%, which resulted in NiO deposition rate of 0.03 nm/s. With the above deposition parameters, the NiO films were p-type with resistivity of $\rho = 5$ $\Omega \cdot cm$ (sheet resistance of 2 M$\Omega$/□ (megaohms per square)), optical transmission of 80% at wavelength $\lambda = 625$ nm (center of the nanocrystal emission peak). They were stable in air and organic solvents used during the chemical processing of the nanocrystals. The glass/ITO/NiO substrates were transferred back into the glove box where they were coated with a monolayer of CdSe/ZnS core/shell nanocrystals by spin-casting out of chloroform. The thickness of the spun-cast nanocrystal films was easily tuned by varying the nanocrystal concentration in chloroform and/or the spin speed during the spin-coating process. The substrates were then transferred, without exposure to air, into the evaporation chamber and a 40 nm thick $Alq_3$ electron-transporting layer was evaporated at $10^{-6}$ Torr, at a deposition rate of ~0.2 nm/s. A 100 nm thick Ag/Mg (1/10 by weight) and 30 nm thick Ag electron-injecting electrode were then evaporated through a shadow mask, forming 1 mm diameter circular electrodes (0.78 $mm^2$ electrode area). In some devices, a 10 nm thick film of 3-(4-biphenylyl)-4-phenyl-5-tert-butylphenyl-1,2,4-triazole (TAZ) hole-blocking layer was evaporated onto the nanocrystal layer prior to the deposition of the $Alq_3$ layer (see S. Coe-Sullivan, et al., Proc. of SPIE vol. 5739, p. 108 (2005), which is incorporated by reference in its entirety). The freshly made devices were removed from the integrated deposition system, without packaging, and immediately tested in air.

Figure 4B:
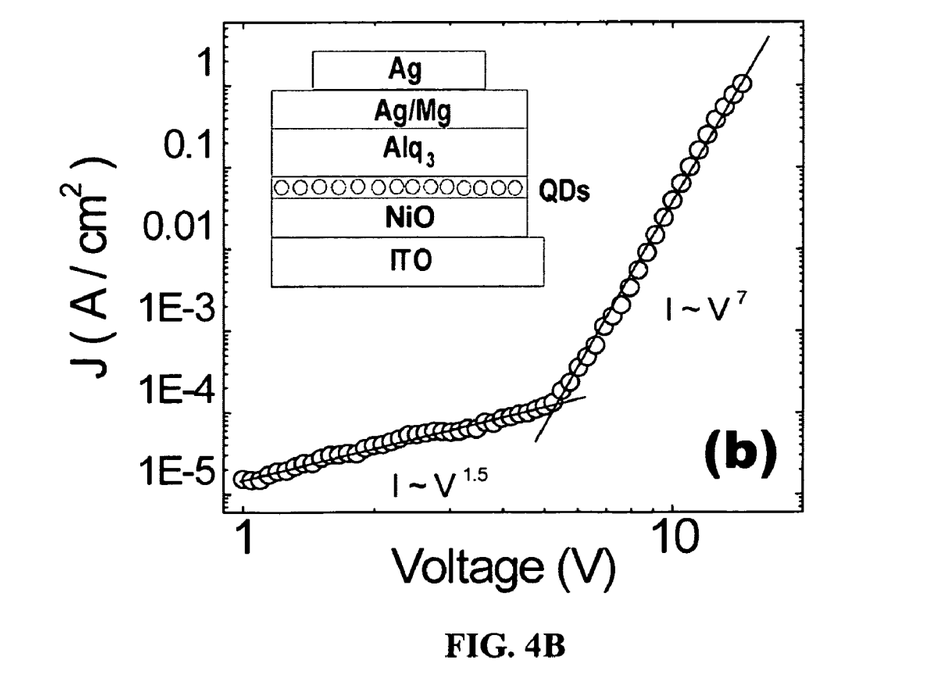
FIG. 4B is a graph depicting electroluminescent properties of a light emitting device.

Typical forward biased current-voltage (I-V) characteristics of a NiO nanocrystal-LED were measured with respect to the grounded Ag cathode, and the results plotted in FIG. 4B.

For most of the nanocrystal-LEDs, $J \propto V^n$ with $1<n<1.5$ below $(6\pm1)$ V and $6<n<7$ at higher voltage. Here, n was the signature of the charge conduction mechanism and was related to the temperature, the density and energy distribution of trap states in the organic or inorganic materials. These I-V curves were consistent with previous reports of trap assisted space charge limited conduction in both CdSe/ZnS closely packed films and OLEDs. See, for example, R. A. M. Hikmet, et al., J. Appl. Phys. 93, 3509 (2003); P. E. Burrows and S. R. Forrest, Appl. Phys. Lett. 64, 2285 (1994); and P. E Burrows, et al., J. Appl. Phys. 79, 7991 (1996); each of which is incorporated by reference in its entirety. The maximum steady-state current density achieved was typically ~4 A/cm$^2$. At that current density, $8 \times 10^7$ carriers per second can be injected into each nanocrystal of the luminescent nanocrystal layer. Since the single exciton recombination time in the nanocrystal devices was $\leq 10$ ns, at this high current level the exciton density per nanocrystal can reach 40%. See, e.g., C. R. Kagan, et al., Phys. Rev. B 54, 3633 (1996); and C. R. Kagan, et al., Phys. Rev. Lett, 76, 1517 (1996); each of which is incorporated by reference in its entirety.

Figure 5:
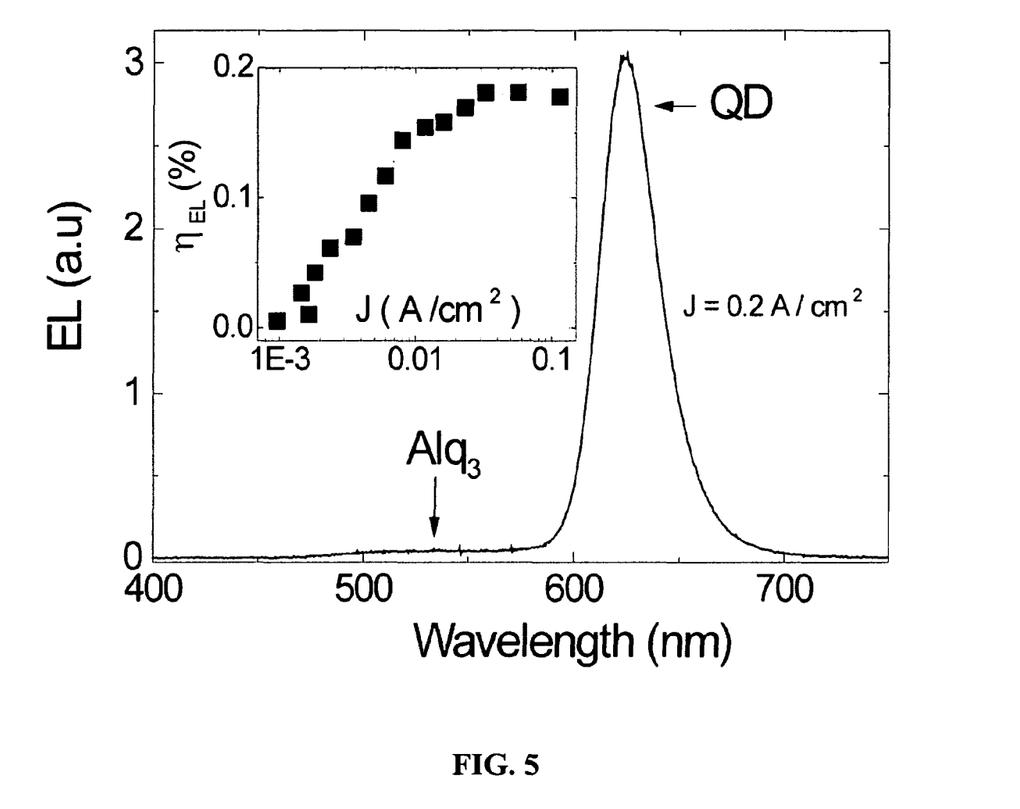
FIG. 5 is a graph depicting electroluminescent properties of a light emitting device.

FIG. 5 shows the EL spectrum of a NiO nanocrystal-LED that included a resistive NiO layer ($\rho=5$ $\Omega \cdot$cm), at current density of 200 mA/cm$^2$. The 30 nm FWHM nanocrystal emission peak centered at $\lambda=625$ nm dominated the EL spectrum. The broader shoulder at $\lambda=530$ nm was due to a weak Alq$_3$ emission. The 1 eV band offset (see the band diagram in FIG. 4A) between the HOMO levels of the nanocrystal and Alq$_3$ enabled hole injection into the Alq$_3$ film. No EL was observed in reversed bias. The inset of FIG. 5 shows the evolution of $\eta_{EL}$ as a function of current density for the same resistive NiO device that was driven up to its breaking point at J>200 mA/cm$^2$. Typical I-V characteristics were consistent throughout the set nanocrystal-LEDs with $\eta_{EL} \leq 0.18\%$ and brightness of up to 40 Cd/m$^2$.

Figure 6A:
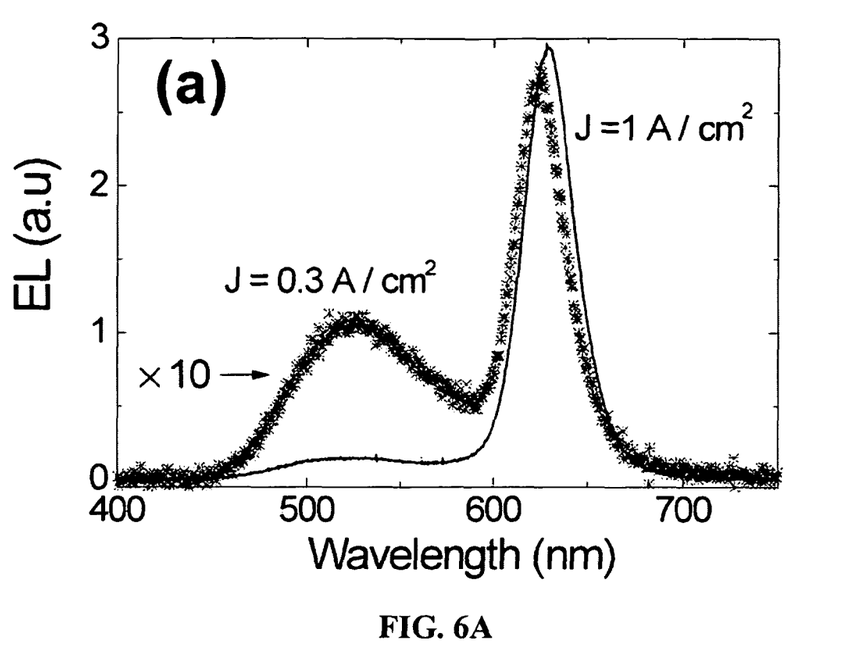
FIGS. 6A-6B are graphs depicting electroluminescent properties of a light emitting device.
Figure 6B:
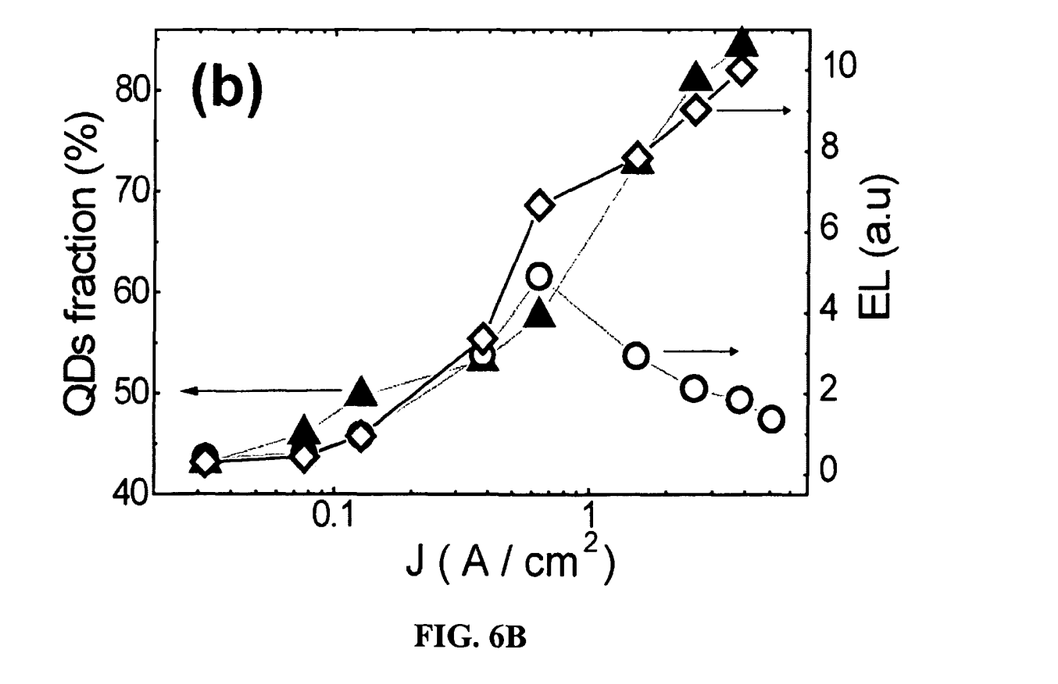

FIG. 6 illustrates the negative impact that low resistance NiO ($10^{-2}$ $\Omega \cdot$cm) had on the nanocrystal-LED EL spectrum. For these devices $\eta_{EL} < 10^{-3}\%$. In contrast to FIG. 5 (in which the device included a more resistive NiO), in FIG. 6 nearly 50% of the detected EL came from the Alq$_3$ layer for current densities lower than 300 mA/cm$^2$ (star symbols in FIG. 6A). This effect was attributed to the imbalance of electron and hole injection into the device due to the highly doped NiO thin films, which enhanced the hole density. The increased hole injection shifted the exciton recombination region into the Alq$_3$ layer, and the excess of NiO holes in vicinity to the luminescent nanocrystals quenched the electroluminescence efficiency of the nanocrystal monolayer. Additionally, an excess of holes in CdSe nanocrystals could lead to ultafast (~100 ps) non-radiative Auger relaxations. See V. I. Klimov, et al., Science 287, 1011 (2000), which is incorporated by reference in its entirety. At 1500 mA/cm$^2$ (solid line in FIG. 6A), 85% of the EL originates from the nanocrystals. The increase in the nanocrystal spectral contribution with current was attributed to the rebalance of charge carrier densities in the device and the decrease in nanocrystal charging at higher electric fields that were responsible for higher current densities. In FIG. 6B, the open circles and open diamonds illustrate the evolution of the integrated areas below the Alq$_3$ and nanocrystal EL peaks, respectively.

In conclusion, nanocrystal-LEDs were fabricated using p-type NiO films as hole-transporting layers. Careful optimization of the NiO resistivity prevented quenching of nanocrystal luminescence and allowed nanocrystal-LED external quantum efficiencies as high as 0.18%. The present nanocrystal-LEDs were less efficient than the best reported nanocrystal-LEDs that utilize a TPD hole transport layer, but in used more stable metal oxide films. A large fraction of the injected current was shunted through the device due to the roughness of the NiO sputtered interface. With smoother NiO films, a significant increase in the nanocrystal-LED efficiency can be expected. Use of covalently-bonded, chemically-stable inorganic hole- or electron-injection layer enabled spin-cast deposition of any nanocrystal solution, unlike the spin-casing on top of solvent-sensitive organic thin films. Consequently, introduction of metal oxides expands and simplifies the fabrication process of nanocrystal-LEDs.

Other embodiments are within the scope of the following claims.

What is claimed is:

1. A light emitting device comprising:
   a first charge transporting layer including a first inorganic material in contact with a first electrode arranged to introduce charge in the first charge transporting layer;
   a second electrode;
   a plurality of colloidally-grown semiconductor nanocrystals disposed between the first electrode and the second electrode; and
   a lightly doped layer proximal to the nanocrystals, wherein the lightly doped layer is doped in an amount effective to minimize non-radiative losses due to exciton quenching by unbound charge carriers in the transporting layer.

2. The light emitting device of claim 1, further comprising a second charge transporting layer in contact with the second electrode, wherein the second electrode is arranged to introduce charge in the second charge transporting layer.

3. The light emitting device of claim 1, wherein the first inorganic material is amorphous or polycrystalline.

4. The light emitting device of claim 1, wherein the first inorganic material is an inorganic semiconductor.

5. The light emitting device of claim 4, wherein the inorganic semiconductor includes a metal chalcogenide.

6. The light emitting device of claim 5, wherein the metal chalcogenide is a mixed metal chalcogenide.

7. The light emitting device of claim 5, wherein the metal chalcogenide includes a zinc oxide, a titanium oxide, a niobium oxide, a zinc sulfide, an indium tin oxide, or a mixture thereof.

8. The light emitting device of claim 1, wherein the second charge transporting layer includes a second inorganic material.

9. The light emitting device of claim 8, wherein the second inorganic material is amorphous or polycrystalline.

10. The light emitting device of claim 8, wherein the second inorganic material is an inorganic semiconductor.

11. The light emitting device of claim 10, wherein the inorganic semiconductor includes a metal chalcogenide.

12. The light emitting device of claim 11, wherein the metal chalcogenide is a mixed metal chalcogenide.

13. The light emitting device of claim 11, wherein the metal chalcogenide includes a zinc oxide, a titanium oxide, a niobium oxide, a zinc sulfide, an indium tin oxide, or a mixture thereof.

14. The light emitting device of claim 1, wherein the first charge transporting layer is a hole transporting layer.

15. The light emitting device of claim 1, wherein the first charge transporting layer is an electron transporting layer.

16. The light emitting device of claim 1, wherein the plurality of semiconductor nanocrystals form a monolayer.

17. The light emitting device of claim 1, wherein the plurality of semiconductor nanocrystals is a substantially monodisperse population of semiconductor nanocrystals.

18. The light emitting device of claim 1, wherein the plurality of semiconductor nanocrystals is arranged in a pattern.

19. The light-emitting device of claim 18, wherein the plurality of semiconductor nanocrystals is arranged in a pattern by microcontact printing.

20. The light emitting device of claim 1, wherein the device is transparent.

21. A method of generating light comprising:
providing a device including a first electrode, a second electrode, a first charge transporting layer including a first inorganic material in contact with the first electrode, and a plurality of colloidally-grown semiconductor nanocrystals disposed between the first electrode and the second electrode, and a lightly doped layer a lightly doped layer proximal to the nanocrystals, wherein the lightly doped layer is doped in an amount effective to minimize non-radiative losses due to exciton quenching by unbound charge carriers in the transporting layer; and
applying a light-generating potential across the first electrode and the second electrode.

22. The method of claim 21, wherein the first inorganic material is amorphous or polycrystalline.

23. The method of claim 22, wherein the first inorganic material is an inorganic semiconductor.

24. The method of claim 23, wherein the inorganic semiconductor includes a metal chalcogenide.

25. The method of claim 24, wherein the metal chalcogenide is a mixed metal chalcogenide.

26. The method of claim 24, wherein the metal chalcogenide includes a zinc oxide, a titanium oxide, a niobium oxide, a zinc sulfide, an indium tin oxide, or a mixture thereof.

27. The method of claim 21, wherein the device further includes a second charge transporting layer including a second inorganic material.

28. The method of claim 27, wherein the second inorganic material is amorphous or polycrystalline.

29. The method of claim 28, wherein the second inorganic material is an inorganic semiconductor.

30. The method of claim 29, wherein the inorganic semiconductor includes a metal chalcogenide.

31. The method of claim 30, wherein the metal chalcogenide is a mixed metal chalcogenide.

32. The method of claim 30, wherein the metal chalcogenide includes a zinc oxide, a titanium oxide, a niobium oxide, a zinc sulfide, an indium tin oxide, or a mixture thereof.

33. The method of claim 21, wherein the plurality of semiconductor nanocrystals form a monolayer.

34. The method of claim 21, wherein the plurality of semiconductor nanocrystals is a substantially monodisperse population of semiconductor nanocrystals.

35. The method of claim 21, wherein the plurality of semiconductor nanocrystals is arranged in a pattern.

36. The method of claim 35, wherein the plurality of semiconductor nanocrystals is arranged in a pattern by microcontact printing.

37. The method of claim 21, wherein the device is transparent.

38. A display including a plurality of light emitting devices, wherein at least one light emitting device comprises:
a first charge transporting layer including a first inorganic material in contact with a first electrode arranged to introduce charge in the first charge transporting layer;
a second electrode;
a plurality of colloidally-grown semiconductor nanocrystals disposed between the first electrode and the second electrode; and
a lightly doped layer a lightly doped layer proximal to the nanocrystals, wherein the lightly doped layer is doped in an amount effective to minimize non-radiative losses due to exciton quenching by unbound charge carriers in the transporting layer.

39. The display of claim 38, further comprising a second charge transporting layer in contact with the second electrode, wherein the second electrode is arranged to introduce charge in the second charge transporting layer.

40. The display of claim 38, wherein the first inorganic material is amorphous or polycrystalline.

41. The display of claim 38, wherein the first inorganic material is an inorganic semiconductor.

42. The display of claim 41, wherein the inorganic semiconductor includes a metal chalcogenide.

43. The display of claim 42, wherein the metal chalcogenide is a mixed metal chalcogenide.

44. The display of claim 42, wherein the metal chalcogenide includes a zinc oxide, a titanium oxide, a niobium oxide, a zinc sulfide, an indium tin oxide, or a mixture thereof.

45. The display of claim 38, wherein the second charge transporting layer includes a second inorganic material.

46. The display of claim 45, wherein the second inorganic material is amorphous or polycrystalline.

47. The display of claim 45, wherein the second inorganic material is an inorganic semiconductor.

48. The display of claim 47, wherein the inorganic semiconductor includes a metal chalcogenide.

49. The display of claim 48, wherein the metal chalcogenide is a mixed metal chalcogenide.

50. The display of claim 48, wherein the metal chalcogenide includes a zinc oxide, a titanium oxide, a niobium oxide, a zinc sulfide, an indium tin oxide, or a mixture thereof.

51. The display of claim 38, wherein the first charge transporting layer is a hole transporting layer.

52. The display of claim 38, wherein the first charge transporting layer is an electron transporting layer.

53. The display of claim 38, wherein the plurality of semiconductor nanocrystals form a monolayer.

54. The display of claim 38, wherein the plurality of semiconductor nanocrystals is a substantially monodisperse population of semiconductor nanocrystals.

55. The display of claim 38, wherein the plurality of semiconductor nanocrystals is arranged in a pattern.

56. The display of claim 55, wherein the plurality of semiconductor nanocrystals is arranged in a pattern by microcontact printing.

57. The display of claim 38, wherein the device is transparent.

* * * * *